United States Patent

Ghosh et al.

[11] Patent Number: 5,889,234
[45] Date of Patent: *Mar. 30, 1999

[54] ZIRCONIA CERAMIC MEMBERS WITH LASER INDUCED ELECTRICAL CONDUCTIVITY IN SURFACES THEREOF

[75] Inventors: Syamal K. Ghosh, Rochester; Gregory S. Jarrold, Henrietta; Dilip K. Chatterjee, Rochester; David C. Press, Webster, all of N.Y.

[73] Assignee: Eastman Kodak Company, Rochester, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 754,454

[22] Filed: Nov. 21, 1996

[51] Int. Cl.$^6$ .................................................. H05K 1/03
[52] U.S. Cl. ........................ 174/250; 174/258; 361/750; 427/555; 501/103
[58] Field of Search ..................................... 174/250, 254, 174/258; 29/846; 427/96, 555; 501/102, 103; 361/748, 750

[56] References Cited

U.S. PATENT DOCUMENTS

| | | | |
|---|---|---|---|
| 4,540,462 | 9/1985 | Mizunoya et al. | 216/33 |
| 4,797,530 | 1/1989 | Iwase | 29/846 X |
| 4,808,463 | 2/1989 | Yoshikatsu et al. | 428/215 |
| 5,145,741 | 9/1992 | Quick | 427/96 X |
| 5,391,841 | 2/1995 | Quick | 174/258 |
| 5,411,690 | 5/1995 | Ghosh et al. | 264/657 |
| 5,543,269 | 8/1996 | Chatterjee et al. | 430/346 |

OTHER PUBLICATIONS

David W. Richerson, Modern Ceramic Engineering, Properties, Processing, and Use in Design, 1992. pp. 471–476.

*Primary Examiner*—Hyung-Sub Sough
*Attorney, Agent, or Firm*—Mark G. Bocchetti

[57] ABSTRACT

A dielectric member with an integral, electrically conductive surface is made by molding a substrate from a zirconia alloy powder using a tape casting process. The resulting green substrate is sintered and after sintering may be cut to the final desired size and shape. Once the insulating ceramic substrate has been formed, the surface of the substrate is modified using infrared laser energy. Through the impingement of infrared laser radiation upon the surface of the ceramic substrate, an electrically conductive region is produced on the surface of the substrate. In such manner, the entire surface can be made electrically conductive or a particular pattern can be traced. As an integral part of the substrate, the surface will not delaminate from the substrate. Further, because the modified surface region and the substrate are both a zirconia, the coefficients of thermal expansion of the substrate and the modified surface region will be closely matched.

7 Claims, 2 Drawing Sheets

ZIRCONIA CERAMIC MEMBERS WITH LASER INDUCED ELECTRICAL CONDUCTIVITY IN SURFACES THEREOF

BACKGROUND OF THE INVENTION

1. Field of the Invention

The present invention relates generally to electrically conductive layers or surfaces on non-conducting substrates and, more particularly, to an electrically conductive surface or pattern integrally formed with a non-conductive ceramic substrate using lasers.

2. Brief Description of the Prior Art

The use of ceramics in the production of capacitors is widely known. In such capacitors, thin ceramic layers or ceramic coatings are bonded to metal substrates. Ceramics are used for their higher dielectric strength and durability against heat. Traditionally, alumina ceramic has been used in conjunction with metals such as copper and aluminum because of the ease of availability. However, prior art devices using these materials have significant shortcomings. There is poor bond development between the alumina ceramic and the various metal electrodes. Further, the combination of alumina ceramic materials with copper or aluminum electrodes has been found to be incompatible at elevated operating temperatures. There have also been recurring problems related to low dielectric properties and bond failure between coatings when used at high power levels.

U.S. Patent No. 5,391,841 to Quick teaches laser processing of ceramic coatings on electronic circuit substrates. A thin ceramic layer, such as alumina, is plasma spray deposited on a relatively thick metal substrate as a heat sink for improved dielectric and thermal properties which are produced by laser-reflow and recrystallization. This laser-reflow and recrystallization provide a different ceramic of higher dielectric and denser structure. Subsequent to the laser treatment of the plasma spray deposited ceramic layer, a metal coating is plasma spray coated onto the ceramic layer. Laser treatment of the ceramic layer apparently improves bond development between the substrate and the ceramic layer.

There is a general problem with adhesion of coatings on metal substrates and there is always the potential for delamination of a coating from the substrate to which it has been applied. This is particularly true if the coefficients of thermal expansion of the substrate and the coating applied thereto are not closely matched when the devices are to be used at elevated temperatures.

SUMMARY OF THE INVENTION

It is, therefore, an object of the present invention to provide a highly insulating substrate, the surface of which is electrically conductive or includes an electrically conductive pattern which is integral with the substrate.

Another object of the present invention is to provide a process for modifying the surface or a selected portion of the surface of a highly insulating ceramic in order to make that surface or a selected portion thereof electrically conductive.

It is a further object of the present invention to provide an integrated conductive surface on an insulating ceramic substrate wherein the conductive surface and the insulating ceramic substrate have substantially similar coefficients of thermal expansion.

Still another object of the present invention is to provide a process for modifying the surface of a highly insulating ceramic in order to provide that surface with a predetermined, electrically conductive pattern.

A further object of the present invention is to provide a process for modifying the surface or a selected portion of the surface of a highly insulating ceramic in order to make that surface or a selected portion thereof electrically conductive wherein the process is reversible such that the surface or a selected portion thereof can be returned to an electrically non-conductive condition.

Briefly stated, these and numerous other features, objects and advantages of the present invention will become readily apparent upon a reading of the detailed description, claims and drawings set forth herein. These features, objects and advantages are accomplished by molding a substrate from a zirconia alloy powder preferably using a tape casting process. The resulting green substrate is sintered and after sintering may be cut to the final desired size and shape. Once the insulating ceramic substrate has been formed, the surface of the substrate is modified using infrared laser energy. Through the impingement of infrared laser radiation upon the surface of the ceramic substrate, an electrically conductive region is produced on the surface of the substrate. In such manner, the entire surface can be made electrically conductive or a particular pattern can be traced. Unlike the prior art or traditional processes for placing conductive coatings or layers onto ceramic substrates, the electrically conductive surface region of the substrate of the present invention is integral with the substrate. As an integral part of the substrate, the surface will not delaminate from the substrate. Further, because the modified surface region and the substrate are both a zirconia, the coefficients of thermal expansion of the substrate and the modified surface region will be closely matched. The process is reversible such that through the subsequent application of heat or laser radiation the electrically conductive surface or pattern, or a potion thereof can be returned to an electrically insulating characteristic. This can be particularly beneficial in many microelectronic prototype production processes where some of the conductive paths are removed or made non-conductive after certain operations are completed. In order to accomplish this in conventional microelectronic manufacturing processes, it is necessary to scrap the old substrate and fabricate a new substrate which incorporates the improved design.

DETAILED DESCRIPTION OF THE PREFERRED EMBODIMENTS

Figure 1:
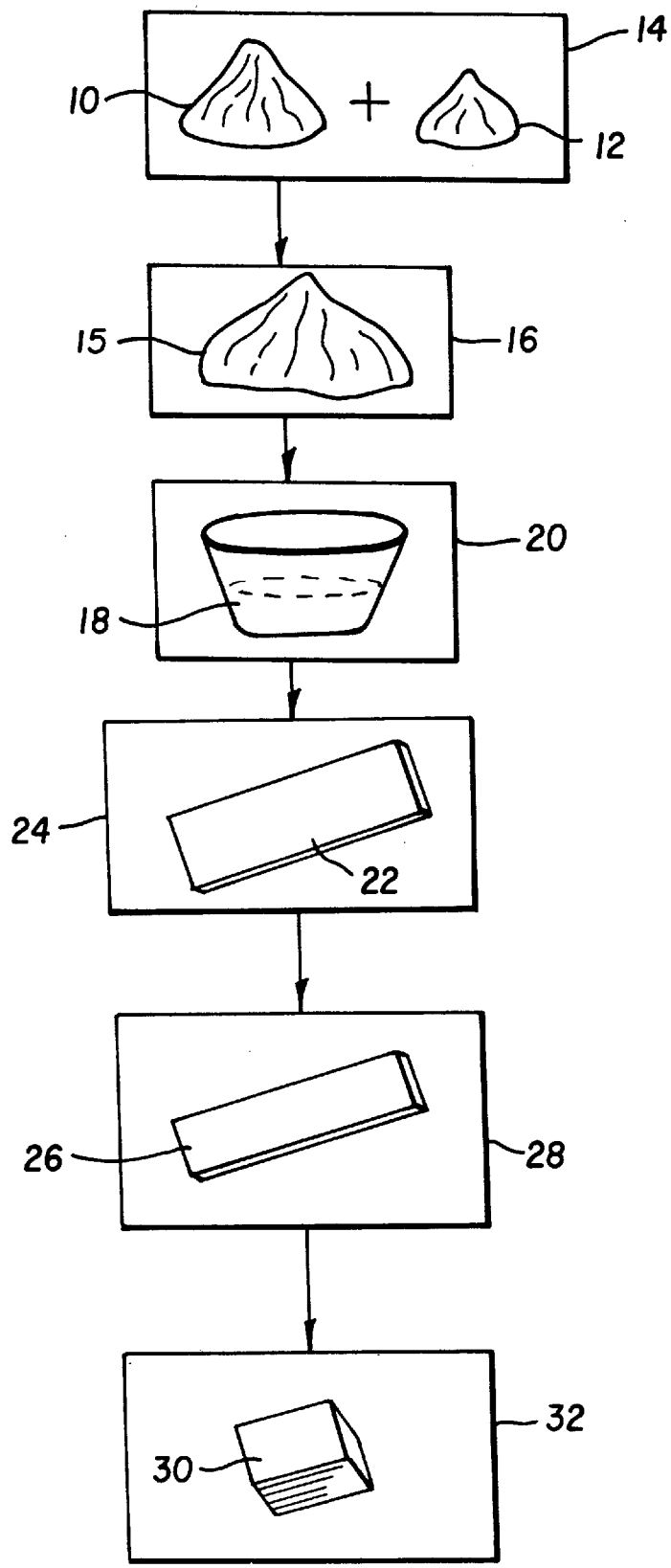
FIG. 1 is a schematic flow diagram of a general method for forming the non-conductive ceramic substrate for use in the practice of the present invention.

Turning first to FIG. 1, there is shown schematically the process for making the thin ceramic, electrically insulating substrate of the present invention. A predetermined quantity of zirconia powder 10 is combined with a predetermined quantity of one or more secondary oxide ceramic powders 12 as indicated by function block 14. Yttria, ceria, calcia and/or magnesia can be used as the secondary powder 12. The combination results in an alloyed zirconia powder 15 as illustrated by function block 16. If yttria or calcia is the selected secondary powder, the range of yttria or calcia combined with the zirconia powder 10 is in the range of from about 0.5 to about 5.0 mole percent. If magnesia is selected as the secondary ceramic powder 12, the amount of magnesia powder combined with the zirconia powder 10 should be in the range of from about 0.1 to about 1.0 mole percent. If ceria is selected as the secondary ceramic powder 12, the amount of ceria powder combined with the zirconia powder 10 should be in the range of from about 0.5 to about 15.0 mole percent.

In the next step of the process, the alloyed zirconia powder 15 is combined with an organic binder, a plasticizer, a dispersant/wetting agent, and an antifoaming agent, and mixed thoroughly to form a slurry 18 as indicated by function block 20. Thin layers (in the range of from about 0.2 to about 2 mm in thickness) of green zirconia ceramic 22 are then produced in a molding process as represented by function block 24. Examples of organic binders which can be used in the formation of slurry 18 are polyvinyl alcohol, polyvinyl acetate, polyvinyl chloride, polyvinyl butryal and polystyrene. The preferred plasticizer for generating slurry 18 is polyethylene glycol. The preferred dispersant and/or wetting agent used in the formation of slurry 18 is isooctylphenylpolyethoxyethanol. The preferred defoaming agent used in the formation of slurry 18 is tributylphosphate.

After the formation of the thin layer 22 of green zirconia ceramic, the thin layers 22 are sintered in air at 1500° C. for two hours to form sintered substrate 26 as represented by function block 28. The process for sintering the thin layers 22 of green zirconia ceramic to form the sintered substrate 26 is disclosed in detail in U.S. Pat. No. 5,411,690 to Ghosh et al which is hereby incorporated herein by reference. The sintered substrates 26 may then be cut or trimmed to the desired size using a diamond cut-off saw to produce finished substrates 30 as represented by function block 32. Sintering the green zirconia ceramic produces a tetragonal polycrystalline structure. The finished substrates 30 are dielectric or insulating members.

That step of the process of molding thin layers 22 of green zirconia ceramic as represented by function block 24 is preferably accomplished by means of tape casting. The zirconia slurry 18 is cast onto a moving carrier substrate (usually a thin film of cellulose acetate) and the edge of a long, smooth plate (a doctor blade) is used to spread the slurry to the predetermined thickness. The binders in the slurry 18 are dissolved in a solvent to lower the viscosity of the slurry so as to enable it to spread into a thin layer. The solvent is added to slurry 18 during the process step of mixing represented by function block 20. Examples of solvents which can be used for this purpose are methyl ethyl ketone, alcohol, and tolulene.

Figures 2, 3:
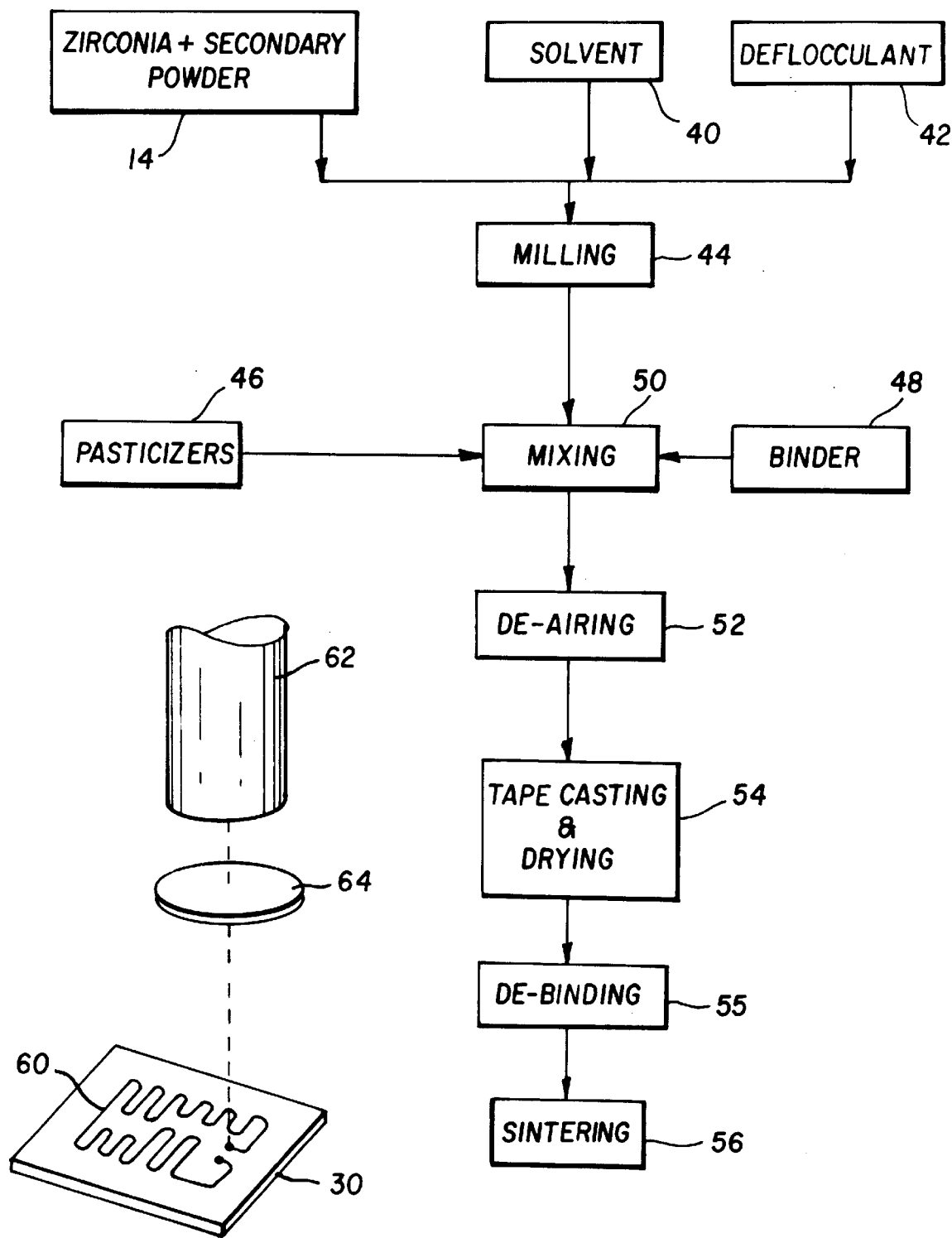
FIG. 2 is a schematic flow diagram of the method for tape casting the non-conductive ceramic substrate for use in the practice of the present invention.
FIG. 3 is a perspective representation depicting the generation of an electrically conductive pattern onto the surface of a non-conductive, ceramic substrate through the use of a laser.

Referring next to FIG. 2, there is shown a flow chart identifying the sequence of process steps in the fabrication of the thin layers 22 of green zirconia ceramic by the process of tape casting. The zirconia alloy powder is combined with a solvent 40 and a deflocculant 42. The combined zirconia alloy powder 14, solvent 40 and deflocculant 42 are then ball milled as indicated by process step block 44. The amount of solvent (such as methyl ethyl ketone or alcohol) added to the zirconia alloy powder 14 should be in the range of from about 15 percent to about 25 percent by weight. The preferred deflocculant is isooctylphenylpolyethoxyethanol. Through ball milling the powder mixture is prevented from lumping into non-homogeneous lumps and a homogeneous mixture is achieved. In addition, the particle size of the powder mixture is reduced and the desired particle distribution is achieved. The average particle size is preferably about 0.3 $\mu$m. The desired particle size distribution is such that 90% of the particles are less than 0.5 $\mu$m, 50% of the particles are less than 0.25 $\mu$m, and 10% of the particles are less than 0.1 $\mu$m. Plasticizers 46 and a binder 48 are then mixed with the ball milled zirconia alloy powder as indicated by process step block 50. The preferred plasticizer 46 is polyethylene glycol and is added to the ball milled zirconia alloy powder in the range of from about two (2) percent to about five (5) percent by weight. The preferred binder is polyvinyl alcohol and is added to the ball milled powder during mixing step 50 in the range of from about ten (10) percent to about twenty (20) percent by weight. The mixing step 50 is performed for at least about two hours and preferably for about twelve hours. The slurry obtained by mixing step 50 is then de-aired to remove entrained air bubbles as indicated by process step block 52. De-airing of the slurry can be accomplished in a vacuum chamber. Upon completion of the de-airing step 52, the slurry is ready for use in the tape casting process mentioned above and indicated in FIG. 2 by process step block 54. After the thin layers of green zirconia ceramic have been tape cast and dried, they are subjected to a de-binding operation as represented by process step block 55 and then sintered as represented by process step block 56.

The de-binding operation results in the removal of most of the organic binders. The debinding operation is preferably performed as an independent process step separate from the sintering step although it is possible to merge the two steps. De-binding is performed at oven temperatures in the range of from about 300° C. to about 600° C. for a period of at least twelve hours and, preferably for about twenty hours. The temperature of the de-binding step is dependent upon the melting point of the organic binders present in the ceramic.

The preferred sintering schedule for sintering the green base element 22 is to sinter such green parts by sequentially:

(a) heating the green parts from about room temperature to about 300° C. at a rate of about 0.3° C./min.;

(b) heating the green parts from about 300° C. to about 400° C. at a rate of about 0.1° C./min.;

(c) heating the green parts from about 400° C. to about 600° C. at a rate of about 0.4° C./min.;

(d) heating the green parts from about 600° C. to about 1500° C. at a rate of about 1.5° C./min.;

(e) maintaining the green parts at about 1500° C. for about 120 minutes to form a sintered substrate;

(f) cooling the sintered substrate from about 1500° C. to about 800° C. at a rate of about 2° C./min.;

(g) cooling the sintered substrate from about 800° C. to about room temperature at a rate of about 1.6° C./min. to form an insulating ceramic substrate. Such sintering schedule is disclosed in U.S. Pat. No. 5,411,690 to Ghosh et al which is hereby incorporated by reference herein.

Referring back to FIG. 1, it will be recognized by those skilled in the art that the step of obtaining thin layers 22 of green zirconia ceramic may be accomplished by processes other than tape casting. For example, such thin layers may also be produced through injection molding, extrusion molding, or dry pressing. If the thin layers 22 of green zirconia ceramic are to be produced by injection molding, then prior to the actual step of injection molding to form the thin green layers 22, it is preferable that the ceramic powder be compounded with a low molecular weight organic binder such as paraffin at a temperature where the binder is liquid and allowed to solidify by cooling. The compounded ceramic powder is then placed in an injection molding machine, heated to a temperature of 70°–90° C. and injected into a mold to form the green part. However, the preferred process step for producing the thin layers 22 of green zirconia ceramic is tape casting because the tape casting process allows for the production of very thin and relatively large area substrates at a lower cost than other processes.

The following is a specific working example of constituents used to produce zirconia ceramic substrates.

WORKING EXAMPLE

Zirconia powder was alloyed with yttria. The amount of yttria was three (3) mole percent. The resulting alloyed zirconia powder was then mixed with the following additives and dissolved in a solvent to form a slurry.

| | |
|---|---|
| Zirconia Powder | 100 gms. |
| Methyl ethyl ketone/ethanol 50:50 mixture (solvent) | 25 gms. |
| Menhaden fish oil* (deflocculent/dispersant) | 0.8 gms. |
| Polyethylene glycol (plasticizer) | 7.5 gms. |
| Polyvinyl alcohol (binder) | 15 gms. |
| Tributylphosphate (defoaming agent) | 1.5 gms. |
| Isooctylphynylpolyethoxyethanol (wetting agent) | 1 gm. |

*The particular menhaden fish oil used was Deflock D-3 ™ as produced by Spencer Kellogg, Inc. of Buffalo, New York.

The alloyed ceramic powder, Methyl ethyl ketone/ethanol, and Menhaden fish oil were added to a ball mill and milled for at least six hours to achieve thorough mixing. The resulting ball milled mixture was then placed in a mixer and mixed with the remaining ingredients listed above for at least twelve hours. The resulting slurry was then allowed to age for at least twelve hours and subsequently de-aired. Viscosity was checked and was maintained at 1000 to 1200 MPas. The slurry was then cast onto a moving carrier surface of cellulose acetate and spread to a controlled and predetermined thickness with the edge of a doctor blade. After the casting process, most of the solvent in the slurry was evaporated away slowly by flowing air over the cast green tape. The green tape is then placed in an oven for removing most of the binder. This de-binding operation resulting in the removal of most of the organic binders was performed at an oven temperature of about 450° C. for a period of 20 hours. The green tape was then sintered (in accordance with the sintering schedule recited above) at 1500° C. for two hours. The long strips of sintered ceramic tape were then cut to the desired size using a diamond cut off saw.

Once the finished substrates 30 are produced in the manner described above, an electrically conductive pattern 60 can be generated on the surface of the finished substrates 30 as shown in FIG. 3. The electrically conductive pattern generated on the surface of the finished substrates 30 can be any desired geometric shape including but not limited to one or more traces, or the entire surface area one or more of the surfaces of the finished substrates 30, or portions of the entire surface area one or more of the surfaces of the finished substrates. An infrared radiation laser 62 having a radiation frequency of 1.06 μm is used to irradiate the zirconia substrate 30 thereby creating the conductive pattern 60. The preferred laser used for creating the electrically conductive pattern 60 is an Nd:YAG laser, Q-switched, optically pumped with a krypton arc lamp. A computer is used to control laser 62. The spot size or beam diameter of laser 62 is preferably in the range of from about 100 to about 600 μm. The spot size or beam diameter can be increased or decreased using an appropriate focusing lens 64. It should be kept in mind that laser spot size is a function of laser-material interaction. The laser spot size depends on the laser wave length and the lens optics.

The following parameters are used in order to produce an electrically conductive pattern 60 on the surface of the insulating sintered zirconia ceramic substrate 30:

| | |
|---|---|
| Laser Power: CW Average | 2 to 40 watts |
| Peak Power | 3.167 kW |
| Pulse Width | 100 μs |
| Scan Speed | 1000 m/s |
| Scan Field | 114.3 mm by 114.3 mm |
| Average Current | 22 A (range: 20.5 A–25 A) |
| Pulse Rate | ≦50 kHz |
| Repeatability | ±25 μm |

The surface area irradiated by laser 62 turned black and under the operating conditions for the laser 62 listed above, the black pattern becomes electrically conductive. The electrical conductivity is believed to be a result of the substoichiometric oxidation state of zirconia ($ZrO_{2-x}$). Evaluation of the black pattern by means of x-ray diffraction by glancing angle process indicates the presence of tetragonal zirconia with no indication of the presence of metallic zirconium. The electrical conductivity of the pattern was measured by applying a steady direct current voltage of 25 volts across two ends of a conductor and measuring the current. The measured electrical resistivity for a given sample was 200Ω–cm and varied between 200 and 500Ω–cm.

Using the process of the present invention, a zirconia substrate 30 can be produced which includes an electrically conductive pattern on one or both of the major planar surfaces thereof. That electrical pattern can be precisely defined by controlling the movement of laser 62 or by controlling the movement of the substrate 30 under laser 62. The pattern can be in the form of one or more specific traces, or can cover the entire surface. By making each major planar surface of the substrate 30 conductive, the process of the present invention can be used to produce capacitors. By imparting a specific electrical pattern 60 to the use of laser 62, the process of the present invention can be used in the production of circuit boards. The conductive patterns generated through the practice of the method of the present invention can be erased in toto or in part. Erasure can be accomplished with the use of a $CO_2$ laser. Impingement on the conductive patterns with radiation at a radiation frequency of 10.6 μm from a $CO_2$ laser will effectively cause the conductive pattern to revert to an insulating characteristic. The operating parameters for a $CO_2$ laser operating in the continuous wave mode necessary to erase the conductive patterns, or portions thereof, are as follows:

| | |
|---|---|
| Laser Power: CW average | 0–60 watts |
| Peak power (at 20% duty cycle) | 300 watts |
| Pulse width | 10–100 μs |
| Scan speed | 1 mm/s–15 m/s |

The ability to erase conductive patterns is particularly beneficial in building prototypes wherein the design of the conductive pattern can be readily changed without the necessity of completely rebuilding all or part of the prototype. Erasure of conductive patterns can also be accomplished through the application of heat. Raising the temperature of the conductive patterns to a range of from about 200° C. to about 500° C. for a period of from about one to about three hours will result in reversion of the conductive patterns to an insulating characteristic.

Although not preferred, the method and article of the present invention can be practiced by forming a composite of the alloyed zirconia ceramic powder 15 (see FIG. 1) described above with alumina. The amount of alumina present in the composite can be as great as 20% by weight. Conductive patterns can be formed in such a zirconia-alumina composites using an IR laser as described above. However, such conductive patterns in zirconia-20% alumina composites have demonstrated a measured electrical resistivity of between 2000 and 5000Ω-cm. Such conductive patterns zirconia-alumina composites are erasable using a $CO_2$ laser as described above.

If, as mentioned above, the thin layers 22 of green zirconia ceramic are produced by the process of dry pressing, the powder employed in the present invention in its precompacted, presintered form comprises zirconium oxide mixed with a secondary ceramic powder as above stated. The powder should have certain properties in order to produce a ceramic of the invention consisting essentially of tetragonal phase, cubic and monoclinic phase-free, crystal structure. Particle size and distribution of the powder should be uniform, having an agglomerate size in the range of from about 30 $\mu$m to about 60 $\mu$m with an average of about 50 $\mu$m. "Agglomerate" can be defined as an aggregate of individual particles of the ceramic powder, and each particle may comprise multiple grains. "Grain" can be defined as crystals, within the particle, having a spatial orientation that is unaligned with or distinct from adjacent grains. The grain size should be in the range of from about 0.1 $\mu$m to about 0.6 $\mu$m, with a preferred size of about 0.3 $\mu$m. The term "net shape" as used herein, e.g. as in net shape ceramic or net shape part, means that the ceramic is dimensionally true after sintering and therefore should not necessitate further machining prior to use in its intended working environment. In other words, the dimensions both of the green part and the ceramic are predictable in that the amount of shrinkage of the green part during sintering is predictable, producing a ceramic part that conforms to a predetermined shape and dimensions. The amount of shrinkage along any axis of the compacted powder form to that of the net shape ceramic should be less than about 0.001 percent in order to obtain close, predictable dimensional tolerances and produce the net shape ceramic of the invention. Such a part can then be put in its intended use without having to carry out a machining operation. Purity of the material should also be well controlled in the range of from about 99.9 percent to 99.99 percent by weight; that is, impurities should be present in the amount of no more than about 0.1 to about 0.01 percent by weight.

The moisture content of the powder should be maintained between about 0.2 to about 1.0 percent by volume of the powder when compacted. Too dry a powder can result in too porous a ceramic, and too high a moisture level can inhibit good release of the green parts from the mold surface. A preferred moisture content is about 0.5 percent.

The powder is compacted into a green part by means of a die press or the like. The term "green part" as used herein means the powder in its compacted, presintered state. The powder should be compacted by applying uniform compacting forces to the powder in order to produce a green part having a uniform density. A preferred compacting device that achieves uniform compacting forces is a floating mold die press. The green part should have a predetermined density selected by the operator to produce, after sintering, a net shape ceramic article. For example, for specific compositions of powder described herein, a preferred green part density is in the range of from about 3.2 g/cc to about 3.5 g/cc. The compaction pressure determines the density of the green part and consequently that of the ceramic. If the compaction pressure is too low, the ceramic can have a lower than desired density and not attain the desired net shape. If the compaction pressure is too high, the green part can delaminate and result in a ceramic that is defective for the intended use, e.g., for cutting. The compaction pressure for the powders of the invention should be in the range of from about 12,000 psi to about 18,000 psi, and a preferred compaction pressure is about 15,000 psi.

The compaction time can be readily determined by the operator depending on the compaction pressure selected. Compaction time, for example, can be in the range of from about 60 seconds to 10 seconds for compaction pressures in the range of from about 12,000 psi to about 18,000 psi, respectively, and about 30 seconds for a compaction pressure of about 15,000 psi. To produce a net shape ceramic according to the invention, the compacting is carried out for a time sufficient to compact the powder to form a green part having a predetermined density for the selected powder, e.g., from about 3.2 g/cc to about 3.5 g/cc as above described. It is well known that the compaction pressure and time selected by the operator can be dependent on the size of the finished part. Generally, as the part size increases, compaction pressure and/or compaction time increase.

The powder is compacted in the presence of an organic water-soluble binder, such as polyvinyl alcohol, gelatin, or a polyester ionomer. The binder can be added to and mixed with the powder, for example, by spray drying or ball milling, prior to placing the powder in the compacting device.

As mentioned above, the preferred means for erasing an electrically conductive area or pattern or area generated in accordance with the process of the present invention is a $CO_2$ laser. Impingement on the conductive patterns with radiation at a radiation frequency of 10.6 $\mu$m from a $CO_2$ laser will effectively cause the conductive pattern to revert to an insulating characteristic. Other lasers operating at different wavelengths can also be used to erase the electrically conductive patterns generated with the process, although not as effectively used for creating the electrically conductive pattern 60 is an Nd:YAG laser, Q-switched, optically pumped with a krypton arc lamp. Other lasers operating at different wavelengths can also be used to practice the method of the present invention or a variation thereof, although not as effectively. An argon laser operating at a radiation frequency of 0.48 $\mu$m can be used to erase (return to an insulating characteristic) an electrically conductive pattern on a surface of a tetragonal zirconia substrate. Erasure of the electrically conductive patterns produced on a surface of a tetragonal zirconia substrate in accordance with the method of the present invention can also be accomplished with a tunable dye laser operating at a radiation frequency of about 0.5 $\mu$m.

It should be recognized that the process of the present invention can be practiced in the negative. One or more entire surfaces of the tetragonal zirconia substrate can be modified to be electrically conductive as described above. Then predetermined patterns or regions of the electrically conductive surface can be returned to an insulating characteristic using a $CO_2$ laser or an argon laser as described above.

From the foregoing, it will be seen that this invention is one well adapted to attain all of the ends and objects hereinabove set forth together with other advantages which are apparent and which are inherent to the process.

It will be understood that certain features and subcombinations are of utility and may be employed with reference to other features and subcombinations. This is contemplated by and is within the scope of the claims.

As many possible embodiments may be made of the invention without departing from the scope thereof, it is to be understood that all matter herein set forth and shown in the accompanying drawings is to be interpreted as illustrative and not in a limiting sense.

What is claimed is:

1. A dielectric member with an electrically conductive surface pattern comprising:
   (a) an alloyed tetragonal zirconia substrate;
   (b) an electrically conductive pattern on a surface of said alloyed tetragonal zirconia substrate integral with said alloyed tetragonal zirconia substrate achieved by irradiating said surface with infrared laser radiation said electrically conductive pattern being comprised of said zirconia.

2. A dielectric member as recited in claim 1 wherein:
   said electrically conductive pattern is erasable by impinging thereon laser radiation from a $CO_2$ laser.

3. A dielectric member as recited in claim 1 wherein:
   said electrically conductive pattern is erasable by heating the electrically conductive pattern in the range of from about 200° C. to about 500° C. such that said electrically conductive pattern is returned to an insulating characteristic.

4. A dielectric member as recited in claim 1 wherein:
   said electrically pattern is erasable by impinging thereon laser radiation from an argon laser.

5. A dielectric member as recited in claim 1 wherein:
   said electrically conductive pattern is erasable by impinging thereon laser radiation from a tunable dye laser emitting radiation at a wavelength of about 0.5 $\mu$m.

6. A dielectric member with an electrically conductive surface pattern comprising:
   (a) a tetragonal zirconia ceramic substrate;
   (b) an erasable, electrically conductive tetragonal zirconia pattern on a surface of said tetragonal zirconia ceramic substrate integral with said tetragonal zirconia ceramic substrate achieved by irradiating said surface with infrared laser radiation, said electrically conductive pattern being returnable to a non-conductive state by impinging thereon laser radiation from a $CO_2$ laser.

7. A dielectric member with an electrically conductive surface pattern comprising:
   (a) a tetragonal zirconia ceramic substrate;
   (b) a laser irradiated, integral surface of said tetragonal zirconia ceramic substrate, said laser irradiated, integral surface being an electrically conductive tetragonal zirconia.

* * * * *